United States Patent
Fujii

[19]
[11] Patent Number: 6,091,084
[45] Date of Patent: Jul. 18, 2000

[54] SEMICONDUCTOR LIGHT EMITTING DEVICE

[75] Inventor: Takehiro Fujii, Kyoto, Japan

[73] Assignee: Rohm Co., Ltd., Kyoto, Japan

[21] Appl. No.: 09/110,866

[22] Filed: Jul. 7, 1998

[30]     Foreign Application Priority Data

Jul. 15, 1997 [JP] Japan ................................ 9-190109

[51] Int. Cl.[7] ............................................. H01L 33/00
[52] U.S. Cl. ........................ 257/82; 257/94; 257/96; 257/97; 257/99; 438/26; 438/39; 438/47
[58] Field of Search ................................ 257/99, 94, 96, 257/97, 82; 438/26, 39, 47

[56]         References Cited

U.S. PATENT DOCUMENTS

| | | | |
|---|---|---|---|
| 5,479,029 | 12/1995 | Uchida et al. | 257/81 |
| 5,557,115 | 9/1996 | Shakuda | 257/81 |
| 5,636,234 | 6/1997 | Takagi | 372/43 |
| 5,798,536 | 8/1998 | Tsutsui | 257/99 |
| 5,990,449 | 11/1999 | Kuhlmann et al. | 257/99 |

FOREIGN PATENT DOCUMENTS 406314822  11/1994  Japan .
 40833572  12/1996  Japan .

*Primary Examiner*—William Mintel
*Attorney, Agent, or Firm*—Arent Fox Kintner Plotkin & Kahn, PLLC

[57]         ABSTRACT

A semiconductor light emitting device has a light emitting chip and a conductive member. A light emitting chip is formed by an insulating substrate. A semiconductor layered portion has semiconductor layers forming a light emitting layer grown on the insulating substrate. A first electrode (p-side electrode) is formed in electrical connection with a first conductivity type semiconductor layer on a surface side of the semiconductor layered portion. A second electrode (n-side electrode) is formed in electrical connection with a second conductivity type semiconductor layer at a position exposed by partly etching the semiconductor layered portion. The light emitting chip is adhered at a backside of the insulating substrate to the conductive member through a conductive adhesive, and the conductive member is electrically connected to the second electrode.

6 Claims, 2 Drawing Sheets

SEMICONDUCTOR LIGHT EMITTING DEVICE

BACKGROUND OF THE INVENTION

This invention relates to a semiconductor light emitting device having a light emitting layer formed on an insulating substrate such as a sapphire substrate. More particularly, the invention relates to a semiconductor light emitting device adapted to prevent a semiconductor crystalline structure from being damaged by static electricity electrified on an insulator substrate, thereby improving reliability.

The light emitting chip (hereinafter referred to as "LED chip") 20 for emitting, for example, bluish light is generally structured by layers of a gallium nitride (GaN) based compound semiconductor on a sapphire substrate 21, as shown in FIG. 4. In such a structure, it is impossible to provide one electrode at a backside of the substrate 21. Consequently, an n-side electrode 29 is provided in electrical connection with an n-type layer at a portion exposed by partly etching the overlying semiconductor layers. Meanwhile, a p-side electrode 28 is provided in electrical connection with a p-side layer on a surface side of the semiconductor layers. This LED chip 20 is, for example, die-bonded in a recess formed at a tip of a first lead 11, as shown in FIG. 4. Wire bonding is made using gold wires between the p-side electrode 28 and a projection 11a formed at the tip of the first lead 11, and between the n-side electrode 29 and a tip of a second lead 12. These elements are encapsulated by a resin which is transparent for a light emitted by a light emitting layer of the chip to form a resin package 14, thus forming a light emitting lamp.

The bluish light LED chip 20, as stated above, uses an electrically insulating substrate as the substrate 21. The substrate 21 at a top surface is provided with a gallium nitride based compound semiconductor layer that is electrically connected to the n-side electrode 29. On the other hand, the substrate 21 at a backside surface is die-bonded through a non-conductive resin, and the chip is die-bonded in an electrically float state. In this state, if static electricity occurs, carriers (electrons or holes) are electrified and built up on the substrate 21. As a result, where a charge amount increases, the carriers move to the semiconductor layer, resulting in a problem that the carriers cause cracks in the semiconductor crystal structure and deteriorate light emitting characteristics.

The n-side electrode 29 may be connected to the first lead with the p-side electrode 28 connected to the second lead. Because the substrate 21 is electrically insulative as stated before, the die bonding for the LED chip 20 is usually by a non-conductive adhesive. The respective surfaces of the substrate 21 are electrically isolated, and the substrate if electrified with carriers has a potential difference.

As in the above-stated bluish-light semiconductor light emitting device, where an electrically-insulative material such as a sapphire is used for the substrate and the substrate at the respective surfaces are out of electrical connection, if static electricity occurs, the substrate has a potential difference between the respective surfaces. If the amount of charge increases to increase the potential difference, the carriers flow into the semiconductor layer, giving rise to a problem that cracks occur in the crystal structure and the light emitting characteristic is badly affected.

SUMMARY OF THE INVENTION

It is an object of the present invention to provide a semiconductor light emitting device which is capable of preventing a substrate from being electrified with static electricity despite the substrate which is formed by an insulating substrate, having thereon semiconductor layers.

A semiconductor light emitting device according to the present invention has a light emitting chip and a conductive member. The light emitting chip comprises: an insulating substrate; a semiconductor layered portion having semiconductor layers forming a light emitting layer grown on the insulating substrate; a first electrode formed in electrical connection with a first conductivity type semiconductor layer on a surface side of the semiconductor layered portion; and a second electrode formed in electrical connection with a second conductivity type semiconductor layer at a position exposed by partly etching the semiconductor layered portion; wherein the light emitting chip is adhered at a backside of the insulating substrate to the conductive member through a conductive adhesive, and the conductive member being electrically connected to the second electrode.

With this structure, the insulating substrate is the same in potential at its opposite surfaces so that the insulating substrate is free from capacitance function and hence free from being electrified with static electricity. Accordingly, the crystal structure in the semiconductor layers is prevented from being damaged.

The semiconductor layered portion for forming the light emitting layer may be composed of a gallium nitride based compound semiconductor. The resulting semiconductor light emitting device, using a gallium nitride based compound semiconductor for bluish light emission, is improved in reliability, despite using a semiconductor material which is particularly weak in static electricity.

If the semiconductor light emitting device is a lamp type light emitting device, the conductive member is composed of a tip of the lead on which the light emitting chip is die-bonded. Also, where the light emitting chip is directly die-bonded to a printed substrate, or where the light emitting chip is mounted on an insulator provided with electrodes at opposite ends thereof, the conductive member is composed of an interconnect pattern (including an electrode pattern) formed on the printed substrate or the chip type insulator.

For a fuller understanding of the nature and advantages of the invention, reference should be made to the ensuing detailed description taken in conjunction with the accompanying drawings.

DETAILED DESCRIPTION

Figure 1:
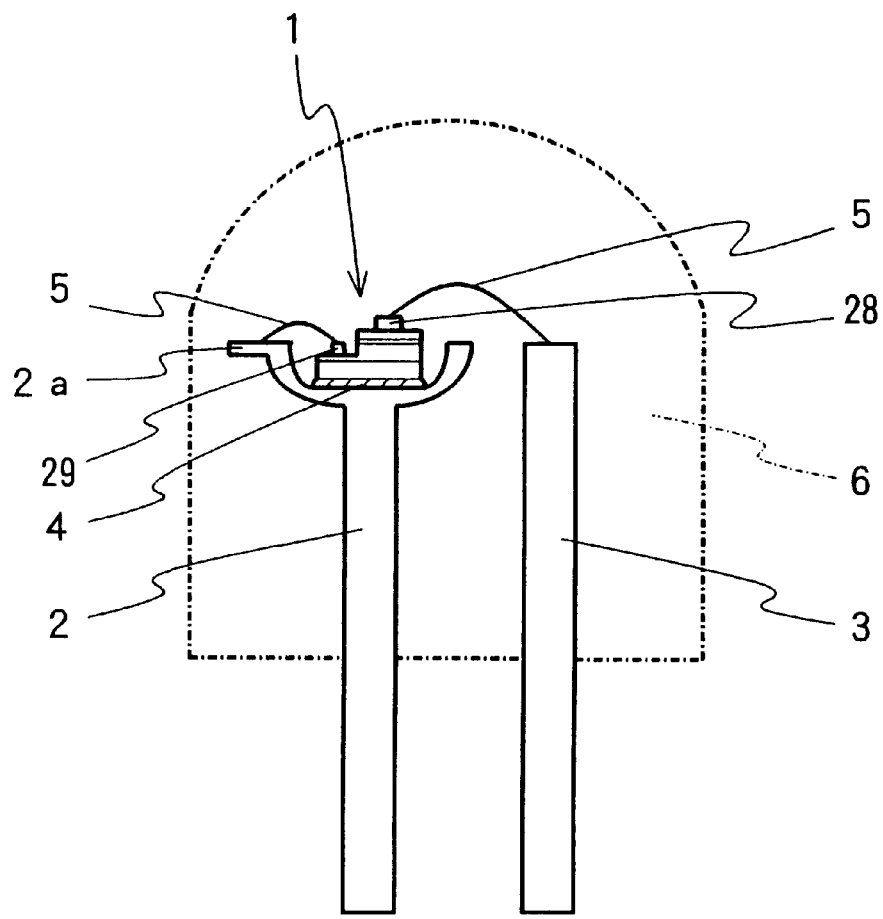
FIG. 1 is a sectional explanatory view of a semiconductor light emitting device according to one embodiment of the present invention.
Figure 2:
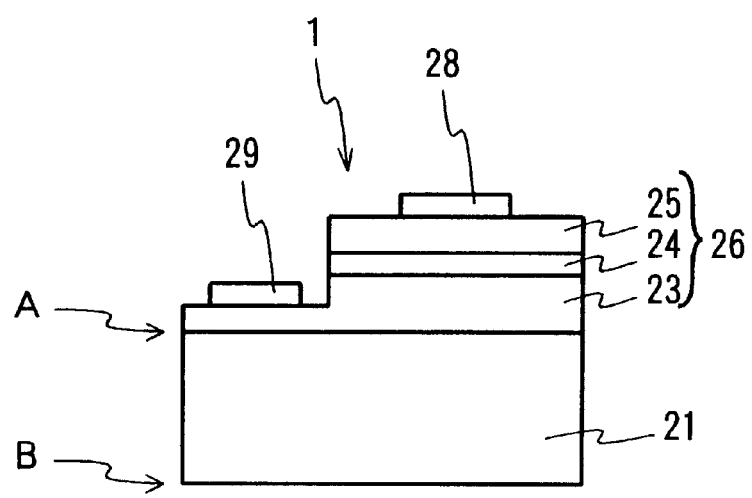
FIG. 2 is a sectional explanatory view as one example of an LED chip of FIG. 1.

An LED chip 1 used for a semiconductor light emitting device of the present invention includes an insulating substrate 21 such as a sapphire substrate, as shown in a sectional explanatory view of FIG. 2. On the insulating substrate 21 are grown a semiconductor layered portion 26 having a plurality of semiconductor layers to form a light emitting layer therein, a first electrode (p-side electrode 28) formed in electrical connection with a first conductivity type semiconductor layer (p-type layer 25) at a top surface of the semiconductor layered portion 26, and a second electrode (n-side electrode 29) formed in electrical connection with a second conductivity type semiconductor layer (n-type layer 23) exposed by partly etching the semiconductor layered portion 26. FIG. 1 shows a sectional view of one embodiment of a semiconductor light emitting device of the present invention, wherein the LED chip 1 structured as above is adhered, at a backside of the insulating substrate 21, to a conductive member as a tip of a first lead 2 through a conductive adhesive 4, and the conductive member is electrically connected to the second electrode (n-side electrode 29).

Explaining the LED chip 1 with greater detail, the insulating substrate 21 is made of sapphire. On the insulating substrate, a low-temperature buffer layer is deposited, for example, of GaN. The n-type layer 23 on the buffer layer, which is a cladding layer made of n-type GaN and/or AlGaN based compound semiconductor (having Al and Ga variable in composition ratio) in a layer thickness of approximately 1–5 $\mu$m, an active layer 24 made of a material having a bandgap energy lower than that of the cladding layer, e.g. an InGaN based (having In and Ga variable in composition ratio) compound semiconductor in a layer thickness of approximately 0.05–0.3 $\mu$m, and the p-type layer (cladding layer) 25 made of a p-type GaN and/or AlGaN based compound semiconductor in a layer thickness of approximately 0.2–1 $\mu$m are grown respectively. The p-side electrode 28 is formed, for example, by a Ti—Au layered structure, which is in electrical connection with the p-type layer 25 through a current-diffusion metal layer, not shown. The current-diffusion metal layer is formed by an Ni—Au alloyed layer on the p-type layer 25. Meanwhile, the n-side electrode 29 is formed, for example, by a Ti—Al alloyed layer, which is in electrical connection with the n-type layer 23 at a location exposed by partly etching the semiconductor layered portion 26. Thus, the LED chip 1 is structured.

This LED chip 1, as shown in FIG. 1, is die-bonded to a curve-faced portion of the first lead 2 through the use of the conductive adhesive, e.g. an Ag paste. The n-side electrode 29 of the LED chip 1 is electrically connected, by wire-bonding with a gold wire 5, to a flange 2a of the first lead 2. The p-side electrode 28, on the other hand, is electrically connected to the second lead 3 also through wire-bonding using a gold wire 5. These elements are molded by an epoxy resin or the like that is transmissible of light emitted by the LED chip 1, thus providing a package 6. The first and second leads 2, 3 are formed of a conductive material, such as Fe or Cu, plated with Ni. or Ag. Accordingly, the LED chip 1 at the n-side electrode 29 is. electrically connected to the flange 2a of the first lead 2 through wire-bonding with the gold wire 5, while the LED chip 1 at the backside of the substrate 21 is in electrical connection with the tip of the first lead 2 through the conductive adhesive. That is, the insulating substrate 21 is electrically short circuited between the respective faces.

According to the present invention, even where the substrate 21, on which the semiconductor layered portion 26 providing a light emitting portion is formed, is an insulating substrate, the substrate backside (see B in FIG. 2) and the opposite surface (see A in FIG. 2) provided with the semiconductor layers are in electrical connection therebetween through the semiconductor layer and the conductor member. This prevents the insulating substrate from acting as a capacitor due to electrification with carriers. Therefore, the insulating substrate is free from being electrified even if static electricity is introduced thereto through the lead which is outwardly extending. Thus, there is no possibility that static electricity builds up on the substrate which may flow into and deteriorate the semiconductor layer. The crystal structure is free from deterioration and lower in light emitting efficiency. Therefore, the device can maintain high characteristics and improve reliability.

Figure 3:
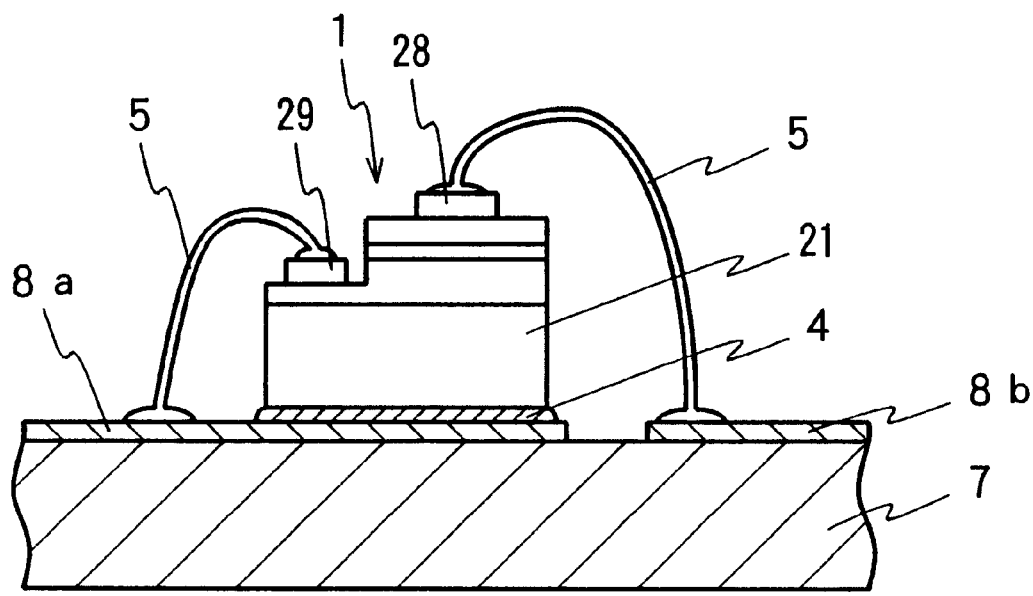
FIG. 3 is a sectional explanatory view of a semiconductor light emitting device according to another embodiment of the present invention.
Figure 4:
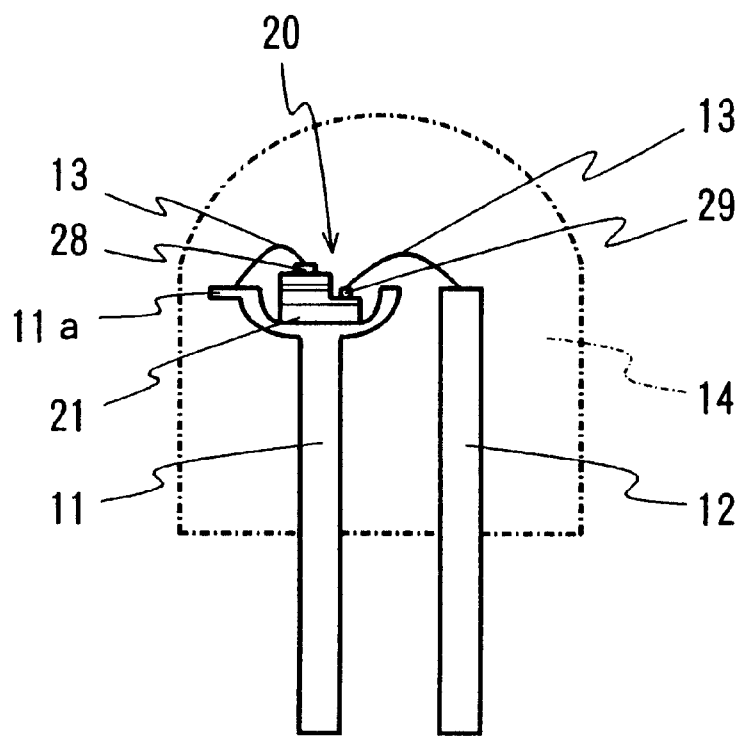
FIG. 4 is an explanatory view as one example of a conventional light emitting lamp using an LED chip having an insulating substrate.

In the above embodiment, the light emitting lamp was formed by molding the LED chip 1 die-bonded to the tip of the lead. The invention is similarly applicable to a case, as shown in FIG. 3, that an LED chip 1 is mounted on an interconnect pattern formed on a printed substrate 7 as a insulating substrate of glass epoxy or the like. That is, the printed substrate 7 is formed with interconnect patterns 8a, 8b at its surface on which an LED chip 1 is die-bonded. In such a case, the LED chip 1 can be die-bonded onto one interconnect pattern 8a through a conductive adhesive such as a silver paste. An electrode (n-side electrode 29), that is electrically connected to a conductivity-type semiconductor layer on a surface of an insulating substrate 21 of the LED chip 1, is wire-bonded through a gold wire 5 to the one interconnect pattern 8a. This serves to maintain respective surfaces of the insulating substrate 21 at a same potential. Accordingly, the insulating substrate 21 is free from being electrified with static electricity. In this manner, where a semiconductor light emitting device is formed by direct die-bonding on a printed substrate 7, the semiconductor light emitting device is high in light emitting efficiency and reliability similarly to the above-stated embodiment. The present invention can also be applied to a chip-type light emitting device having a structure that is provided with opposite electrodes wherein an LED chip 1 is die-bonded on one of the opposite electrodes or a conductive material electrically connected therewith so that the LED chip 1 and its periphery is molded by a resin.

Incidentally, although in the above embodiments the LED chip was of a doublehetero structure, the invention is applicable to a usual pn junction structure instead of the double-hetero structure. Further, besides a gallium nitride based compound semiconductor chip, the present invention is applicable to such a chip that has semiconductor layers of a material other than the gallium nitride based compound semiconductor provided that they are formed on an insulating substrate.

According to the present invention, a semiconductor light emitting device having semiconductor layers on an insulating substrate is prevented from being electrified by static electricity leading to damage to the light emitting chip, thereby maintaining a light emitting characteristic having high reliability.

Although preferred embodiments have been described in some detail, it is to be understood that certain changes can be made by those skilled in the art without departing from the spirit and scope of the invention as defined by the appended claims.

What is claimed is:

1. A semiconductor light emitting device having a light emitting chip and a conductive member, said light emitting chip comprising:

an insulating substrate;

a semiconductor layered portion having semiconductor layers forming a light emitting layer grown on said insulating substrate;

a first electrode formed in electrical connection with a first conductivity type semiconductor layer on a surface side of said semiconductor layered portion; and a second electrode formed in electrical connection with a second conductivity type semiconductor layer at a position exposed by partly etching said semiconductor layered portion;

wherein said light emitting chip is adhered at a backside of said insulating substrate to said conductive member through a conductive adhesive, and said conductive member being electrically connected to said second electrode.

2. A semiconductor light emitting device according to claim 1, wherein said semiconductor layered portion for forming said light emitting layer is composed of a gallium nitride based compound semiconductor.

3. A semiconductor light emitting device according to claim 2, wherein said insulating substrate is composed of a sapphire substrate, and said semiconductor layered portion being formed on said sapphire substrate thereby forming said light emitting chip.

4. A semiconductor light emitting device according to claim 1, wherein said conductive member is a tip portion of a lead on which said light emitting chip is die-bonded, and said light emitting chip and said tip portion of said lead being molded by a transparent resin in a dome form into a lamp type device.

5. A semiconductor light emitting device according to claim 1, wherein said conductive member is an interconnect pattern formed on a chip type insulator, and said light emitting chip and a periphery thereof being molded by a transparent resin into a chip type device.

6. A semiconductor light emitting device according to claim 1, wherein said conductive member is an interconnect pattern formed on a printed substrate.

* * * * *